(12) United States Patent
Drummond et al.

(10) Patent No.: US 6,633,017 B1
(45) Date of Patent: Oct. 14, 2003

(54) SYSTEM FOR PLASMA IGNITION BY FAST VOLTAGE RISE

(75) Inventors: Geoffrey N. Drummond, Fort Collins, CO (US); George McDonough, Loveland, CO (US); Richard A. Scholl, Fort Collins, CO (US); Tim Kerr, Fort Collins, CO (US); John G. Harpold, Bellvue, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 09/529,431

(22) PCT Filed: Oct. 13, 1998

(86) PCT No.: PCT/US98/21534

§ 371 (c)(1),
(2), (4) Date: Apr. 12, 2000

(87) PCT Pub. No.: WO99/20087

PCT Pub. Date: Apr. 22, 1999

Related U.S. Application Data (60) Provisional application No. 60/061,941, filed on Oct. 14, 1997.

(51) Int. Cl.[7] .............................................. B23K 10/00
(52) U.S. Cl. ........................... 219/121.57; 219/121.54; 219/121.43
(58) Field of Search ....................... 219/121.36, 121.54, 219/121.57, 141.43; 315/111.31, 111.57, 344, 338; 313/161, 162; 156/345

(56) References Cited

U.S. PATENT DOCUMENTS

| | | | |
|---|---|---|---|
| 3,569,777 A | 3/1971 | Beaudry | 315/111.21 |
| 3,616,405 A | 10/1971 | Beaudry | 204/192 |
| 3,704,219 A | 11/1972 | McDowell | 204/192 |
| 3,763,031 A | 10/1973 | Scow et al. | 204/298.08 |
| 4,032,862 A | 6/1977 | Huchital et al. | 315/94.5 |

(List continued on next page.)

FOREIGN PATENT DOCUMENTS

| | | |
|---|---|---|
| DE | 1514322 | 9/1969 |
| JP | 58-158929 | 9/1983 |
| JP | 60-98168 | 6/1985 |

OTHER PUBLICATIONS

Norstrom, "Experimental and Design Information for Calculating Impedance Matching Networks for Use in RF Sputtering and Plasma Chemistry", Oct. 1979.

Mazza, "Automatic Impedance Matching System for RF Sputtering", IBM J. Res. Develop., vol. 14, No. 2, Mar. 1970.

Halperin, et al., "Automatic RF Sputtering System", J. Vac. Sci. Tech., 15 (1), Jan. Feb. 1978.

Rahaim, "Automatic Tuning Controller for Anode Tuned Sputtering System", IBM Tech. Disclosure vol. 19, No. 11, Apr., 1977.

*Primary Examiner*—Mark Paschall
(74) *Attorney, Agent, or Firm*—Santangelo Law Offices, P.C.; Luke Santangelo (57) ABSTRACT

An improved system of igniting a plasma using a rapid voltage rise and thus causing ions that may be pre-existing to create secondary electron emission or the like is provided. In one embodiment, the voltage rise can be timed to be comparable to the transit time of the electrons across the plasma. It can also be arranged to achieve a voltage rise in less than 1000 microseconds, to result in a transition time that is less than one hundred times the transit time, to maximize the emission of secondary electrons, or even to merely result in collision energies ranging from 5 to 500 electron volts. The transition time can be controlled through an ignition control that may be programmable, may involve charging output storage devices, or may involve delayed switching to supply the increased voltage to the plasma after the storage elements have been more fully charged.

18 Claims, 4 Drawing Sheets

U.S. PATENT DOCUMENTS

| | | | |
|---|---|---|---|
| 4,247,804 A | * 1/1981 | Harvey | 315/344 |
| 4,306,175 A | 12/1981 | Schleicher et al. | 315/111.21 |
| 4,589,398 A | 5/1986 | Pate et al. | |
| 4,629,887 A | 12/1986 | Bernier | 250/251 |
| 4,629,940 A | 12/1986 | Gagne et al. | 315/111.51 |
| 4,803,405 A | 2/1989 | Nakano et al. | 315/111.21 |
| 4,956,582 A | 9/1990 | Bourassa | 315/111.21 |
| 4,990,859 A | 2/1991 | Bouyer et al. | 324/649 |
| 5,077,499 A | 12/1991 | Oku | 315/111.21 |
| 5,116,482 A | 5/1992 | Setoyama et al. | 204/298.08 |
| 5,118,996 A | 6/1992 | El-Hamamsy et al. | 315/248 |
| 5,140,223 A | 8/1992 | Gesche et al. | 315/111.21 |
| 5,535,906 A | 7/1996 | Drummond | 216/67 |
| 5,561,350 A | 10/1996 | Frus et al. | |
| 5,645,698 A | 7/1997 | Okano | 204/192.12 |
| 5,824,988 A | * 10/1998 | Tylko | 219/121.57 |

* cited by examiner

SYSTEM FOR PLASMA IGNITION BY FAST VOLTAGE RISE

This application is a National Phase Application filing under 35 U.S.C. 371 of International Patent Application, Ser. No. PCT/US98/21534, filed Oct. 13, 1998, which claims the benefit of U.S. patent application Ser. No., 60/061,941, filed Oct. 14, 1997, each hereby incorporated by reference.

I. TECHNICAL FIELD

This invention relates to the field of plasma processing, which field comprises Physical Vapor Deposition (PVD), Plasma Enhanced Chemical Vapor Deposition (PECVD), film etching and patterning, surface modification, ashing, desmearing, and other plasma processes used in industry and research. Specifically, the invention relates to the narrower aspect of igniting a plasma in a processing system within which thin film processing is affected by the plasma.

II. BACKGROUND OF INVENTION

To begin plasma processing one must create a plasma, which is a diffuse mixture of ions and electrons, usually (but not necessarily) at a pressure less than that of a standard atmosphere. The plasma is sustained by a variety of physical mechanisms, but to begin one must create an excess of electrons or ions. In most cases the sustaining mechanism then puts energy into the system to allow the charged particles to ionize other atoms and thus build the plasma density up to a working level.

As but one example, one might examine the plasma deposition system which uses a process called sputtering, a form of Physical Vapor Deposition (PVD). A common system for accomplishing sputtering uses a source which may provide a magnetic trap for electrons, and some power supply or means for pumping energy into the plasma through an electric field created by placing a voltage on an element called a target. This type of system, called a magnetron, is very commonly used to create and maintain plasmas for the purpose of sputtering deposition of thin films of metals and dielectrics onto appropriate substrates.

Such a system is usually thought of as being limited to certain pressure ranges for several reasons. In particular, at the lower end of the pressure range it becomes difficult to ignite the plasma, even though a plasma, once ignited, may be sustained and utilized for sputtering. It is often desirable to operate at these lower pressures because less of the background gas will be included in the growing film, gas phase scattering of the deposition stream is reduced, and unwanted chemical reactions with the background gas are lessened, among other reasons. In operating in the pressure region where ignition is difficult or even impossible, several approaches have been taken in the prior art to aid in starting the plasma. First, a pressure burst may be introduced into the system. That is, the pressure control system is caused to increase the pressure to a level at which plasma ignition can be achieved and may even be reliable and easy, and then the pressure is lowered again to the working level. Alternatively, auxiliary sources of ions or electrons may be used to increase the charge and therefore the probability of plasma ignition. These have included adding sources of ionizing radiation (radioactive sources), supplying high frequency power to the target or an auxiliary electrode, adding hollow cathodes or thermionic filaments to the system, or other sources of ions or electrons.

All of these methods add complexity to the system and may change the operating characteristics of the process so that non-uniform or unstable results may be obtained. Yet there has been a long term desire to operate at the lower pressures and this has driven workers in the field to use these methods in spite of their disadvantages.

In addition, many thin film processing applications involve the precise processing of one or more items in a very dynamic environment. This dynamic environment is not only unpredictable, it may cause fluctuations in a variety of characteristics necessary to cause the gas involved to ignite into a plasma. Thus, while in some other applications the plasma can be ignited by merely achieving the necessary conditions, in thin film processing applications, this is not always possible. The dynamic nature of the chamber itself and its unpredictability, may make knowing the conditions necessary for ignition extremely difficult from a practical perspective. Thus approaches such as that disclosed in U.S. Pat. No. 5,288,971 (hereby incorporated by reference) developed by Advanced Energy Industries, Inc. (the assignee of the present invention) have been created. This approach, while useful for many applications does not fully address other problematic applications.

As in the situation faced by the aforementioned prior art, two other aspects exist which explain the difficulty those attempting to ignite a plasma for thin film processing have faced. First, as mentioned, the processing is often very delicate. As semi-conductor manufacturing techniques have been refined, the thickness of the layers within them has decreased to the atomic scale. Thus, tolerances within the processing itself have become much more exacting. While at first glance this would appear to relate only to the operation of the plasma, not to its ignition, such is not the case as the environment during ignition itself can literally ruin the processing desired. Prior to the present invention, however, a technique for igniting a plasma in a processing system which both worked for the types of applications addressed here and which appropriately minimized undesirable effects has not existed.

As before, ignition (as well as processing itself) can be considered to be an eclectic art in some respects. While on the one hand the physical and chemical processes involved during thin film processing have been studied and refined from very theoretical bases to produce state of the art devices, still, oftentimes, some of the equipment utilized to actually achieve the thin film processing and the techniques which have been applied to achieve ignition might even be characterized as developed on a trial-and-error basis. It may even be said that while those skilled in the art of thin film processing might typically have a great degree of skill and technical knowledge in the plasma processes themselves, those so skilled rarely combined such knowledge with equivalent understanding of process and mechanisms involved in the ignition of the plasma or the electrical circuitry characteristics as well.

Prior to the present invention, several other techniques were known to ignite plasmas in general. Primarily, these techniques included the addition of separate equipment in order to achieve the conditions necessary to ignite the gas into a plasma. An example of these is U.S. Pat. No. 4,906,811 which discloses the addition of separate equipment to locally increase pressure in the gas to effect conditions more conducive to the ignition of the gas into a plasma. Different techniques similarly add separate equipment to create other such drastic changes. U.S. Pat. No. 4,557,819 discloses a separate DC voltage source to momentarily increase the voltage across the gas by about 5,000 volts; U.S. Pat. No. 4,888,088 discloses a separate, lower frequency power source to achieve ignition; and finally, U.S. Pat. No. 4,859, 909 discloses the utilization of ion sources or electron sources to prompt the ignition of the gas into a plasma. As mentioned, each of these utilizes separate equipment to effect gross changes under which ignition of the plasma is almost certain to occur. The techniques used however, have not been accomplished in a manner which demonstrates the type of understanding of the environment as disclosed here.

III. DISCLOSURE OF INVENTION

Accordingly, the present invention is directed to a system for enhancing plasma ignition through manipulation of the voltage applied to the plasma electrodes in a manner which achieves advantages compared to those approaches previously used. This system is designed to achieve a manipulation so that a rapidly rising voltage waveform may act to concentrate free ions and thus increase the probability and variability of conditions which permit plasma ignition. The present invention discloses techniques which now achieve or perhaps more reliably accomplish ignition of a plasma in a thin film processing system. By making what might be seemingly subtle changes to the way in which existing equipment is operated, significant increases in the likelihood of ignition may often be achieved.

Accordingly a general object of the present invention is to achieve ignition without additional equipment. In keeping with this goal, the invention teaches the uses of operating equipment in a new manner for ignition purposes. As one embodiment, it is the goal of the invention to manipulate the operating equipment in a fashion which is likely to quickly and reliably ignite the plasma.

It is also an object of the present invention to permit plasma ignition at a variety of conditions especially at a lower pressure than has been heretofore possible. Similarly, it is an object of the present invention to permit more reliable plasma ignition at low operating pressures. It is thus a goal to permit more variation in the pressures possible for an plasma ignition environment and to permit ignition at pressures desired to be used in certain operating conditions.

It is a further object of the present invention to minimize or perhaps eliminate the utilization of other techniques to achieve plasma ignition. As one example, it is an object to perhaps eliminate any need for a change in pressure to effect plasma ignition. Another broad object of the present invention is to minimize the impact of ignition within a processing system. An object is thus to allow ignition while avoiding separate inputs to the processing environment.

It is another object of the present invention to avoid or minimize any requirement for additional components or systems with such a system. As one example, it is an object to eliminate any need to include sources of ions or electrons to effect plasma ignition at low pressures.

As in earlier inventions, another broad object of the invention is to establish a new type of fundamental criteria which can then be varied to create a variety of techniques to achieve reliable ignition.

Naturally, further objects of the invention are disclosed throughout other areas of the specification and claims. Certainly, other objects and advantages of the present invention are apparent from a reading of the specification.

V. MODES FOR CARRYING OUT THE INVENTION

As can be easily understood, the basic concepts of the present invention may be embodied in a variety of ways. They involve both ignition techniques as well as devices to accomplish the appropriate technique. In addition, while some system designs are disclosed, it should be understood that these not only accomplish certain methods but also can be varied in a number of ways. Importantly, as to all of the foregoing, all of these facets should be understood to be encompassed by this disclosure. The invention broadly teaches the characteristics from which numerous techniques can be developed.

Accordingly, the present invention is directed to a system for enhancing plasma ignition through different manipulations of the voltage applied to the plasma electrodes. These manipulations can be accomplished so that a rapidly rising voltage waveform is applied to the plasma electrode. The voltage may be preferred to start at zero volts. Such a rapid rise in voltage can have a significant effect on the ignition of the plasma.

Figure 1:
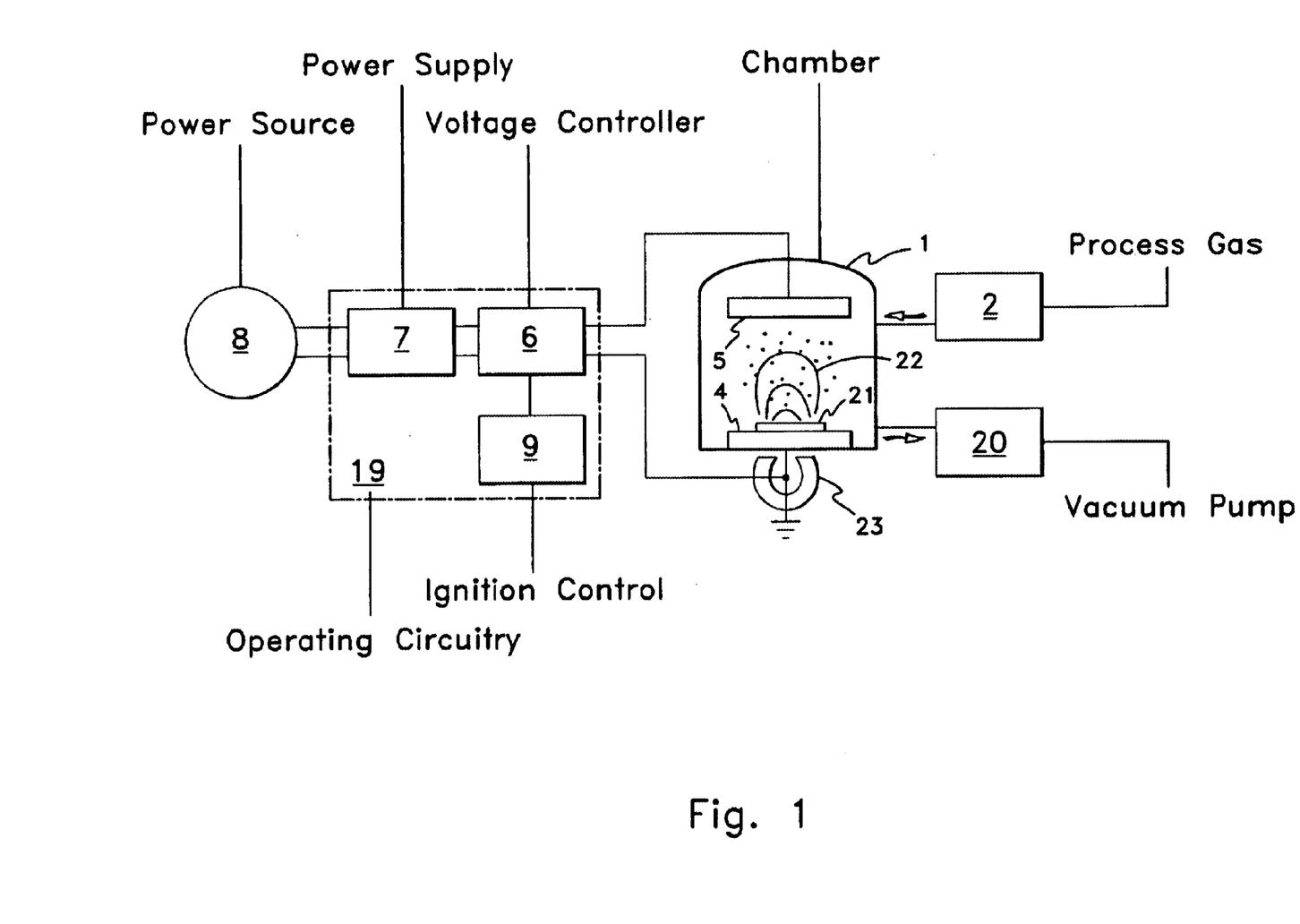
FIG. 1 is a block diagram of a system able to achieve operation according to an embodiment of the invention.

Referring to FIG. 1, the block diagram of a plasma processing system, the basics can be easily understood. Such a system usually involves chamber (1) into which an item to be processed (21) has been placed. Within chamber (1) usually a vacuum is maintained through the use of vacuum pump (20). Process gas (2) may be fed into chamber (1) and may be maintained at some desired pressure. Electrodes (4 and 5) within chamber (1) may be connected to operating circuitry (19) which acts within chamber (1) to initially cause ignition of the gas, often processing gas (2), into a plasma (3) within chamber (1). To enhance the operation of plasma (3) a magnetic field (22) may be included through some type of magnet element (23). During plasma processing, plasma (3) acts upon item (21) within chamber (1). In this fashion, coating, etching, cleaning, or some other action may be achieved on item (21).

As can be seen from FIG. 1, operating circuitry (19) may include several elements which may or may not be integrated as one in actual systems. Certainly power is derived from some source shown schematically in FIG. 1 as power source (8). The power may also be amplified or otherwise conditioned by power supply (7). This conditioned power may be either AC or DC in nature. As contemplated in one embodiment of the present invention, power supply (7) supplies direct current (DC) power. Another embodiment may supply alternating current (AC) power, typically in the radio frequency range of about 13.56 megahertz. Regardless, power supply (7) may feed its power into chamber (1) through or may include a voltage controller (6). This voltage controller (6) may serve to supply the desired voltage for appropriate processing and may even react to conditions within chamber to permit consistent processing. In addition, voltage controller may be separately or integrally controlled to achieve ignition by some ignition control (9).

As background to the operation of the system, it should be understood that it is known that, even in seemingly inert environments, such as a vacuum chamber with no voltages applied to electrodes (4 and 5) (ie. prior to plasma ignition), that there exist a small number of ions in the free space. These ions are presumably created by mechanisms such as interception by a neutral gas atom of ionizing radiation from naturally occurring radioisotopes of the metals making up the chamber, for example. There are also normally cosmic rays, which if intercepted by a neutral atom will ionize it. There are ions created by atomic collisions due to thermal energy in the residual gas, and there may be other ionization mechanisms as well. Most of these have a low probability of occurrence, and so there may be only a few ions at any time residing in the chamber (1). Also, there are loss mechanisms, such as ions traveling at thermal velocities to the wall of the chamber where they may pick up an electron and become neutral again. The balance of the creation and loss mechanisms creates, however, some small level of ionization in the chamber.

Figure 2:
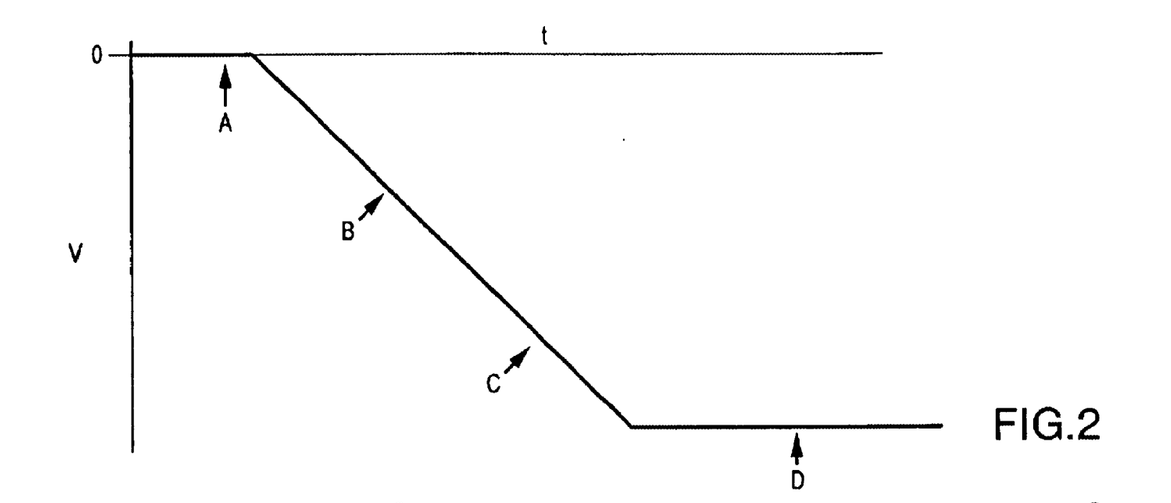
FIG. 2 is a diagram and plot of ignition events as they are believed to occur in some instances of the prior art.
Figure 2A:
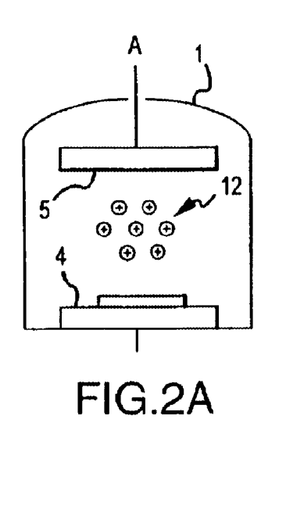
Figure 2B:
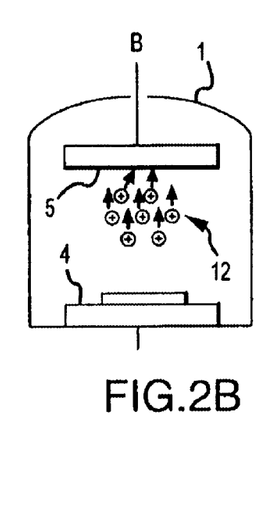
Figure 2C:
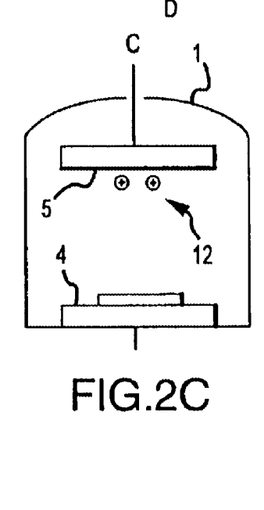
Figure 2D:
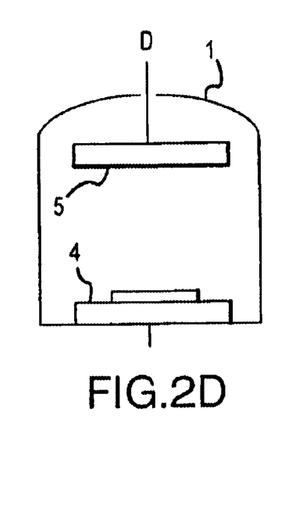

As shown diagrammatically in FIG. 2, if the voltage on electrodes (4 and 5) is slowly changed (defined relative to the movement of the naturally existing ions) negatively from zero, the typically positive ions will be attracted to it and will be swept from the chamber (1). This is shown as the coordinated cathode voltage waveform (11) of FIG. 2 and its sequence of events 2A–2D. As events 2B & 2C depict, the ions (12) will travel to the cathode or negative electrode (4) and strike it with an energy proportional to the voltage on the negative electrode (4) at the instant of arrival. Since the ions (12) are not very massive and since electrical forces are strong, the ions will be accelerated toward the electrode and will usually arrive in a short time, on the order of microseconds. If, as an example, the voltage on the negative electrode (4) is being increased (negatively) at the rate of 10 volts per microsecond and it takes the ions (as an example) 5 microseconds to arrive at the negative electrode (4), they will arrive with an energy of 50 electron volts, assuming they are singly charged. This relatively low energy of collision (defined as compared to the amount of energy necessary to achieve a beneficial effect on ignition) likely does not enhance ignition. Instead, as shown at the instance of arrival of the ions (12) in sequence event 2C, the ions (12) arrive and merely neutralize at the surface with no secondary emission of electrons or the like and no beneficial effect on ignition.

Figure 3:
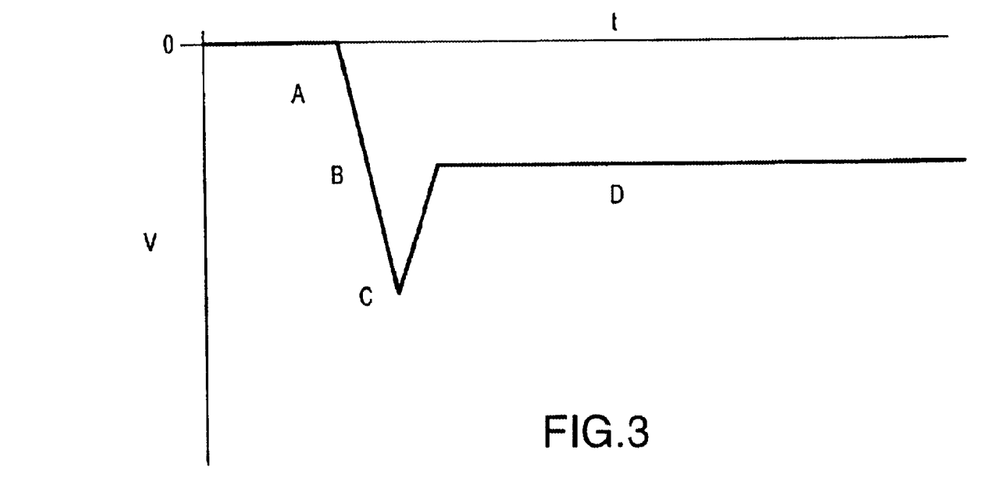
FIG. 3 is a diagram and plot of ignition events as they are believed to occur in one embodiment of the present invention.
Figure 3A:
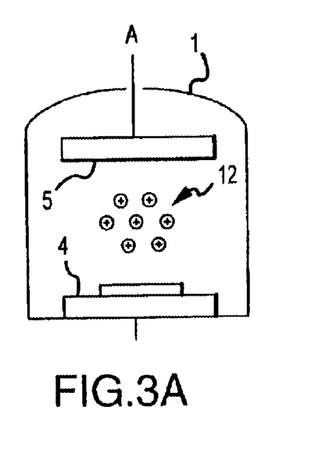

Referring to FIG. 3, it can be seen that if, on the other hand, the voltage on the negative electrode (4) is increased at a much faster rate, the ions (12) will strike the negative electrode (4) with a higher energy. For example an increase in rate to 500 volts per microsecond will usually cause a larger accelerating voltage for the ions (12) during the time they transit from their initial position to the electrode. Even though this larger acceleration will shorten the transit time of the ions, they will still arrive with a higher energy, because the transit time due to the increase in acceleration decreases only as the square root of the voltage while the energy increase is linear.

Figure 3B:
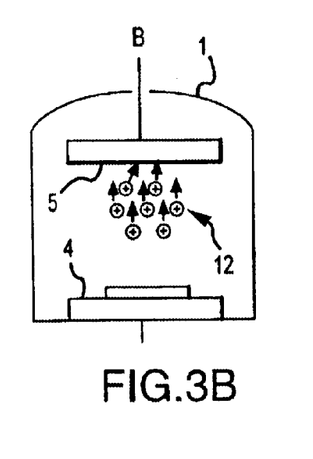
Figure 3C:
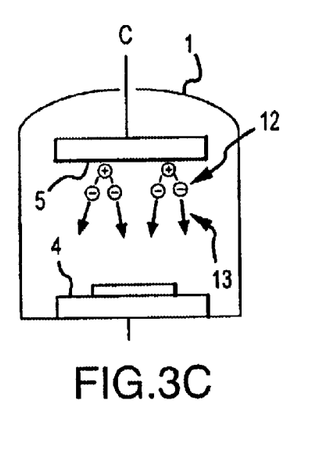
Figure 3D:
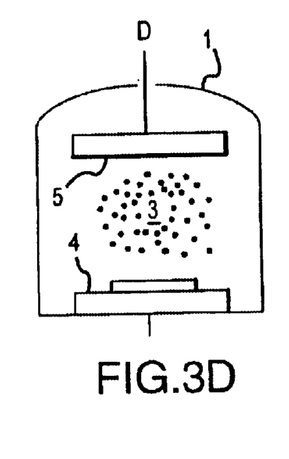

When an ion (12) strikes the negative electrode (4) it may cause emission of an electron from the electrode surface, a process known as secondary emission. It is well known that the probability of such electron emission, known as the secondary emission coefficient, is increased as the energy of the ions (12) increases, up to a maximum value. Below that maximum, the higher the energy of the ion (12) the higher the probability an electron (13) will be emitted, and it is possible at increasing ion energy for some materials that there will be more than one electron emitted from the surface due to the ion impact. It would therefore be desirable that the ions (12) strike the target with an energy close to the maximum value in order to create a maximum number of secondary or other electrons (13), in order to enhance the probability of plasma ignition. It is thus desirable to increase the voltage applied to negative electrode (4) in plasma chamber (1) as fast as possible to a voltage corresponding to this maximum value to enhance ignition probability. This is one basis for the present invention. As shown in FIG. 3, the higher rate of increase in the voltage to some desired maximum negative value (which may or may not be coordinated with the operating voltage desired) may enhance ignition. As shown in the sequence of events 3B and 3C, the high dV/dt can cause arrival of the ions (12) with sufficiently high energy so as to cause an emission of electrons (13). The presence of these electrons (13), which now will be driven across the location in which plasma (3) is desired to exist to the positive electrode (5), can enhance ignition if the plasma chamber (3).

In one embodiment, a low energy power supply, such as a multiphase switch-mode power supply, (such as described in U.S. Pat. No. 5,535,906 to Advanced Energy Industries, Inc. hereby incorporated by reference) may be rapidly turned on to supply the fast rising voltage waveform. This is possible because such a low energy power supply may not have an output filter; such a filter stores energy and must be charged up before the output of the power supply can deliver any substantial voltage. With this type of arrangement, voltage pulses from 0–1500V can be delivered in less than ten microseconds. As those skilled in the art of such power supply design would readily understand, other techniques may be utilized to assist in creating the rapidly rising voltage. These may include series switches such as a semiconductor switch or other fast acting switch as also described herein.

Figure 4:
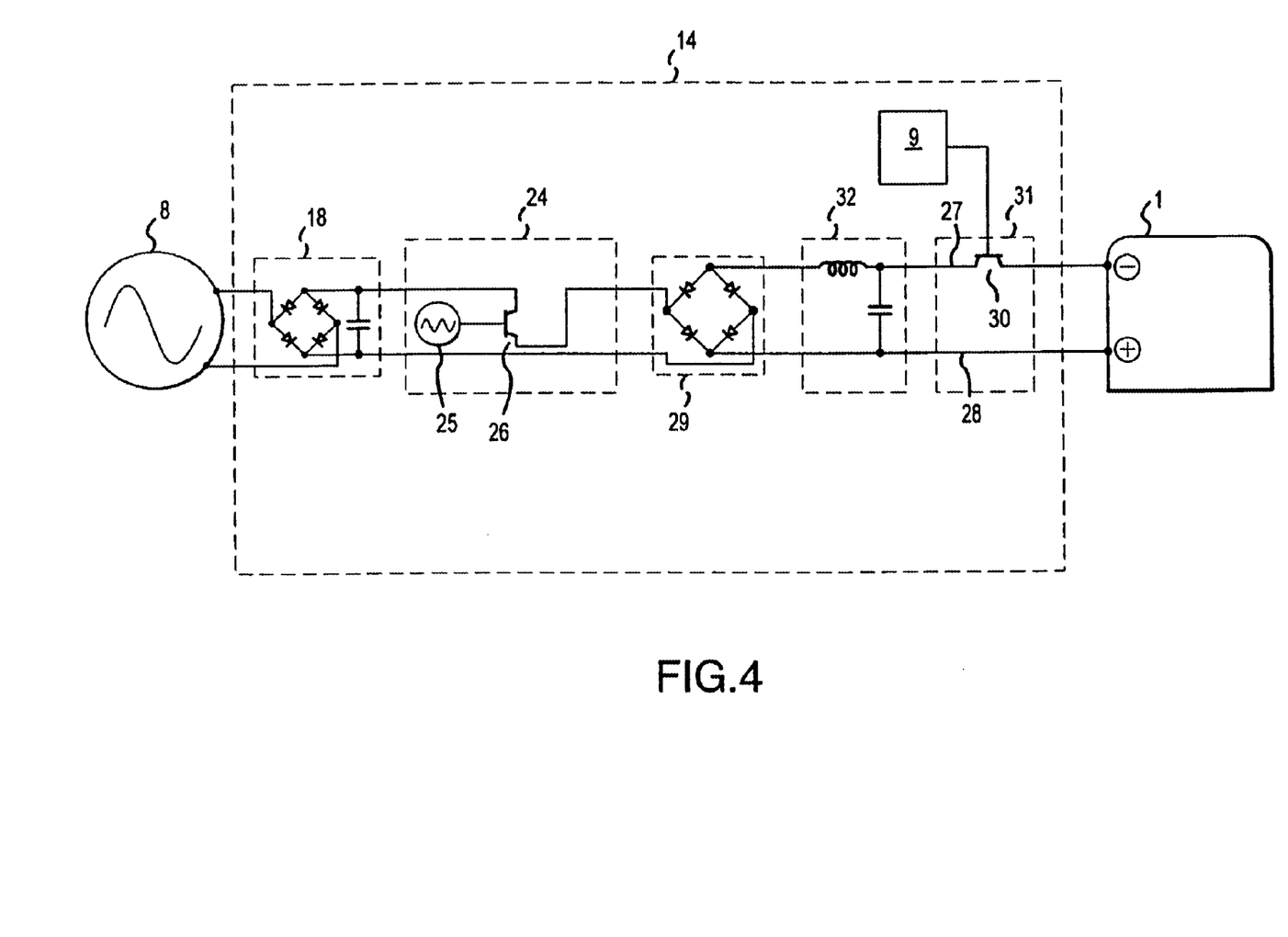
FIG. 4 is a simplified electrical schematic of one type of circuitry to achieve operation according to one embodiment of the present invention.

In another embodiment, shown in FIG. 4 a standard AC or DC power supply, such as a switch-mode DC power supply (14) which because of its usual output filter (32) might be slow to respond, may be fitted with a series switch (15), which when actuated as a result of ignition control (9) may apply an fast rising waveform to the plasma chamber (1) without the need for the power supply to be able to respond rapidly. As shown and readily understood, such a switch-mode power supply (14) may include the various elements such as described in U.S. Pat. No. 5,645,698 to Advanced Energy Industries, Inc. (hereby incorporated by reference). These elements may include some converter or other means for converting alternating power (18), a switcher or other means for switching said direct current (24) which may itself include a high frequency oscillator (25) to cause switching of switching element (26), a rectifier or other means for rectifying (29), and a filter or other means for filtering (32), each of which involve known circuitries. In addition, such a system may include a ignition circuitry (31) which may include a fast acting series switch (30) on one or the other of the leads (27 or 28). This ignition circuitry may be controlled by or may be integral to ignition control (9) or voltage controller (6) to achieve the effects described above.

A series switch (15) as described above may be composed of any of the following devices MOSFETs, IGBTs, or SCRs or similar such items. In such an arrangement, the method of operation may be to first have the series switch (15) in the open state. The DC or AC source might next be applied with the series switch in an open and blocking state. Finally, the switch might be closed. In this type of operation, the rise time to the cathode (4) might be in the time frame of less than one micro second. Naturally it should be understood that all the time frames mentioned may be varied up and down by factors (or divisors) of two, five, ten, twenty or even one hundred or more or orders of magnitude so long as the fundamental principles explained above are achieved.

A shunt type switch that actuates into a passive output circuit that effects a voltage amplification such as a pulse transformer or matching network is also possible. The same switches could also be used as described above, with the addition of a self triggering thyristor or some type of 'break over device'. This shunt switch arrangement could be activated when the supply output voltage (and chamber voltage) reached a predetermined level.

In establishing the voltage levels possible, it should be understood that the voltages may be set by the principles explained above for the various material that may be encountered and the various ions that may cause the collisions. For typical materials and ions, it is believed that ignition may take place using values near one thousand volts. Again this may be varied up or down by factors (or divisors) of two, five, ten, twenty or even one hundred or more or orders of magnitude so long as the fundamental principles explained above are achieved. In addition, percentages such as merely over 100%, 150%, or two or three multiples of the desired operational voltage may also be used depending on the sensitivity of the application. It may also be desired to minimize peak voltages at the cathode (4) for some applications. A trade-off reducing the optimal ignition or secondary electron emission voltage may even be used since some applications appear sensitive to high voltages which may increase particle damage on the substrate due to electrostatic induced particle movement within the chamber. It may also be possible to permit user controllable peak voltages available for ignition and to even discriminate voltages between re-ignition and initial ignition conditions.

It should be understood that, in describing the invention in terms of PVD and in particular magnetron sputtering, it should not be thought that the invention is in any way limited to this application. In any plasma system ignition is difficult (but may be desirable) at low pressures or under other adverse conditions, and the practice of the concept of fast voltage rise to assist in the ignition process will be useful.

In addition to a typical mode of operation described above, it should be understood that the system may also be operated in a repetitive mode, that is, it could be a repetitive process. In this operation, if the ion density is too low to effect ignition, one can reduce the voltage to zero, allow sufficient time for ions (12) to reform in the chamber (1), and then re-apply the fast rising voltage. This process can be repeated until plasma ignition occurs. The repetitive high dV/dt pulse or operation can be applied to increase ignition probability. After the first high dV/dt voltage ramp is applied, the cathode or negative electrode (4) voltage can be reduced to zero or some low value. During this zero voltage or low voltage phase, spurious radiation may generate electron-ion pairs which have zero or low net drift velocities due to the zero or low value cathode or negative electrode (4) voltage. The time period for this zero voltage or low voltage phase may vary as necessary to maximize the total population of ions (12) or electron ion pairs. After the end of the zero voltage or low voltage phase another high dV/dt voltage ramp may be applied to the cathode (4). This process of applying high dV/dt voltage ramps followed by zero voltage or low voltage phases can be repeated as necessary to achieve ignition. The process of applying high dV/dt voltage ramps followed by zero voltage or low voltage phases can be terminated by sensing or detecting plasma ignition, thus the system may include some sensor separately or as part of the voltage control circuitry (6). This sensor may act in a variety of ways such as during processing to cause re-ignition or to terminate the repetitive ignition process described above. The circuitry may also include a timer element so that termination of the repetitive process may occur at the end of some fixed time frame whether or not plasma ignition has been detected, or by some other deterministic means. It may then even trigger other ignition schemes.

In the repetitive mode, it is the intent of this enhanced ignition system to impart critical kinetic energy to the available free ions before an external drift voltage, of some average or net DC level has reduced or eliminated their effective or useful population density. To that end it is also possible that an AC voltage waveform or any arbitrary, net zero, waveform could also be applied to the cathode (4) such that any average or net DC voltages are zero or minimal while providing critical kinetic energy to begin the process of glow discharge, or ignition. It may also be possible to immediately follow this application of AC voltage with a DC voltage from a DC power source. This DC source may or may not be connected or associated with the AC source that initializes the glow discharge or ignition. This DC source may even be derived through some naturally occurring rectification that occurs when AC voltage is applied to a plasma through a cathode or some other electrode. In this manner, it may be possible to increase ignition probabilities at low pressure by applying an AC waveform of adequately high frequencies relative to ion displacement and of adequately high voltage to a DC sputtering magnetron, to initiate glow discharge and ignition. Such a use of RF before a net DC voltage is applied may include or even require a RF blocking device whether this be a passive 'tank' circuit or a semiconductor devices as described in reference to the series switch arrangement.

The discussion included in this patent is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Apparatus claims may not only be included for the device described, but also method or process claims may be included to address the functions the invention and each element performs. Neither the description nor the terminology is intended to limit the scope of the claims.

It should be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure.

In addition, each of the various elements of the invention and claims may also be achieved in a variety of manners. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. For example, regarding this last aspect, the disclosure of a "switch" should be understood to encompass disclosure of the act of "switching"—whether explicitly discussed or not—and, conversely, were there only disclosure of the act of "switching", such a disclosure should be understood to encompass disclosure of a "switch." Such changes and alternative terms are to be understood to be explicitly included in the description.

Any references mentioned in the application for this patent as well as all references listed in any information disclosure filed with the application are hereby incorporated by reference; however, to the extent statements might be considered inconsistent with the patenting of this/these invention(s) such statements are expressly not to be considered as made by the applicant(s) in this application.

We claim:

1. A plasma processing system comprising
  a. a plasma zone within a vacuum chamber within which a plasma exists and having a less than standard atmospheric pressure;
  b. a power supply;
  c. an electrode to which said power supply is connected; and
  d. an ignition control system to cause the output voltage of said power supply to transition to an ignition level in a transition time comparable to a transit time required for an ion to transit said plasma zone during said transition time.

2. A plasma processing system comprising:
  a. a plasma zone within a vacuum chamber within which a plasma exists and having a less than standard atmospheric pressure;
  b. a power supply;
  c. an electrode to which said power supply is connected; and
  d. an ignition control system to cause the output voltage of said power supply to transition to an ignition level in a time less than 100 times a transit time required for an ion to transit said plasma zone during said transition time.

3. A plasma processing system comprising:
  a. a plasma zone within a vacuum chamber within which a plasma exists and having a less than standard atmospheric pressure;
  b. a power supply;
  c. an electrode to which said power supply is connected; and
  d. an ignition control system which acts to cause the emission of secondary electrons by rapidly transitioning the output voltage of said power supply to an ignition level in a transition time.

4. The plasma processing system of claim 1, 2, or 3 wherein said power supply has energy storage elements in its output circuitry and said ignition control system comprises a circuit which programs said power supply to charge said energy storage elements with sufficient energy to achieve said voltage transition in said transition time.

5. The plasma processing system of claim 1, 2, or 3 wherein said power supply has energy storage elements in its output circuitry and said ignition control system comprises a circuit which programs said power supply to charge said energy storage elements with sufficient energy to achieve said voltage transition in said transition time, and further comprises an element to prevent said ignition level from being applied to said plasma until said ignition level has been reached.

6. The plasma processing system of claim 4, wherein said transition time is less than 1000 microseconds.

7. The plasma processing system of claim 4, wherein the energy of said ion after transiting said plasma zone during said transition time is within the range of 5 to 500 electron volts.

8. The plasma processing system of claim 5, wherein said transition time is less than 1000 microseconds.

9. The plasma processing system of claim 5, wherein the energy of said ion after transiting said plasma zone during said transition time is within the range of 5 to 500 electron volts.

10. A method of plasma processing, comprising the steps of
  a. creating a plasma zone within a vacuum chamber within which a plasma exists and having a less than standard atmospheric pressure;
  b. supplying a voltage to an electrode within said plasma zone; and
  c. changing said voltage from zero to an ignition level in a transition time comparable to a transit time required for an ion to transit said plasma zone during said transition time.

11. A method of plasma processing, comprising the steps of
  a. creating a plasma zone within a vacuum chamber within which a plasma exists and having a less than standard atmospheric pressure;
  b. supplying a voltage to an electrode within said plasma zone;
  c. changing said voltage from zero to an ignition level in a transition time less than 100 times a transit time required for an ion to transit said plasma zone during said transition time.

12. A method of plasma processing, comprising the steps of
  a. creating a plasma zone within a vacuum chamber within which a plasma exists and having a less than standard atmospheric pressure;
  b. supplying a voltage to an electrode within said plasma zone;
  c. causing the emission of secondary electrons by rapidly changing the voltage supplied to said electrode within said plasma zone to an ignition level in a transition time;
  d. igniting a plasma within said plasma zone; and
  e. plasma processing at least in part through action of said plasma.

13. The method of plasma processing as described in claim 10, 11, or 12 wherein said step of supplying a voltage further comprises the step of programming a power supply connected to said electrode and having an output circuit, and wherein said step of changing said voltage further comprises the step of programming said power supply to charge energy storage elements in the output circuits of said power supply with sufficient energy to reach the ignition level during said transition time.

14. The method of plasma processing as described in claim 10, 11, or 12 wherein said step of supplying a voltage further comprises the step of programming a power supply connected to said electrode and having at least one output circuit, and wherein said step of changing said voltage further comprises the steps of:
   a. programming said power supply to charge energy storage elements in said output circuit of said power supply with sufficient energy to reach said ignition level; and
   b. preventing said ignition level from being applied to said plasma until said ignition level has been reached.

15. The method of plasma processing as described in claim 13, wherein said step of changing said voltage occurs in a time less than 1000 microseconds.

16. The method of plasma processing as described in claim 13 wherein said step of changing said voltage occurs in a time such that the energy of said ion after transiting said plasma zone during said transition time is within the range of 5 to 500 electron volts.

17. The method of plasma processing as described in claim 14 wherein said step of changing said voltage occurs in a time less than 1000 microseconds.

18. The method of plasma processing as described in claim 14 wherein said step of changing said voltage occurs in a time such that the energy of said ion after transiting said plasma zone during said transition time is within the range of 5 to 500 electron volts.

* * * * *